(12) United States Patent
Kurowski et al.

(10) Patent No.: US 7,742,507 B1
(45) Date of Patent: Jun. 22, 2010

(54) METHOD AND SYSTEM FOR PHASE AND BYTE ALIGNMENT ON A MULTIPLEXED HIGH SPEED BUS

(75) Inventors: Christopher W. Kurowski, Nepean (CA); Naim Ben-Hamida, Nepean (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 944 days.

(21) Appl. No.: 11/391,537

(22) Filed: Mar. 28, 2006

(51) Int. Cl.
*H04J 3/02* (2006.01)
(52) U.S. Cl. .................. 370/540; 370/249; 370/538; 375/376
(58) Field of Classification Search ............. 370/224, 370/249, 537–541, 916; 375/376
See application file for complete search history.

(56) References Cited

U.S. PATENT DOCUMENTS

| | | | | |
|---|---|---|---|---|
| 6,636,532 B1 * | 10/2003 | Dorschky | ............... | 370/537 |
| 7,154,914 B1 * | 12/2006 | Pechner et al. | ............... | 370/516 |
| 7,443,890 B2 * | 10/2008 | Nejad et al. | ............... | 370/541 |
| 7,447,443 B2 * | 11/2008 | Bai | ............... | 398/183 |
| 2004/0028088 A1 * | 2/2004 | Nakamura et al. | ............... | 370/539 |
| 2008/0075222 A1 * | 3/2008 | Lee et al. | ............... | 375/376 |

* cited by examiner

*Primary Examiner*—Steven H Nguyen
*Assistant Examiner*—Curtis A Alia
(74) *Attorney, Agent, or Firm*—Christopher & Weisberg, P.A.

(57) ABSTRACT

A method and system for multiplexing a plurality of serialized data signals in which a first integrated circuit device generates a plurality of serialized data signals. A second integrated circuit device is in electrical communication with the first integrated circuit device. The second integrated circuit device includes a multiplexer operable to generate a multiplexed output signal from the plurality of serialized data signals received from the first integrated circuit. A phase data and byte snapshot back channel is transmitted from the second integrated circuit device to the first integrated circuit device. The phase data and byte snapshot back channel carries phase data and periodic snapshots of the serialized data signals. The phase data and byte snapshot back channel is used by the first integrated circuit device to adjust the phase of each of the plurality of serialized data signals to preserve bit and byte alignment. Such a method and system can be implemented as a 4×10 Gbit/Sec. system that is multiplexed to a 40 Gbit/Sec. stream as may be used in optical transmission systems.

25 Claims, 3 Drawing Sheets

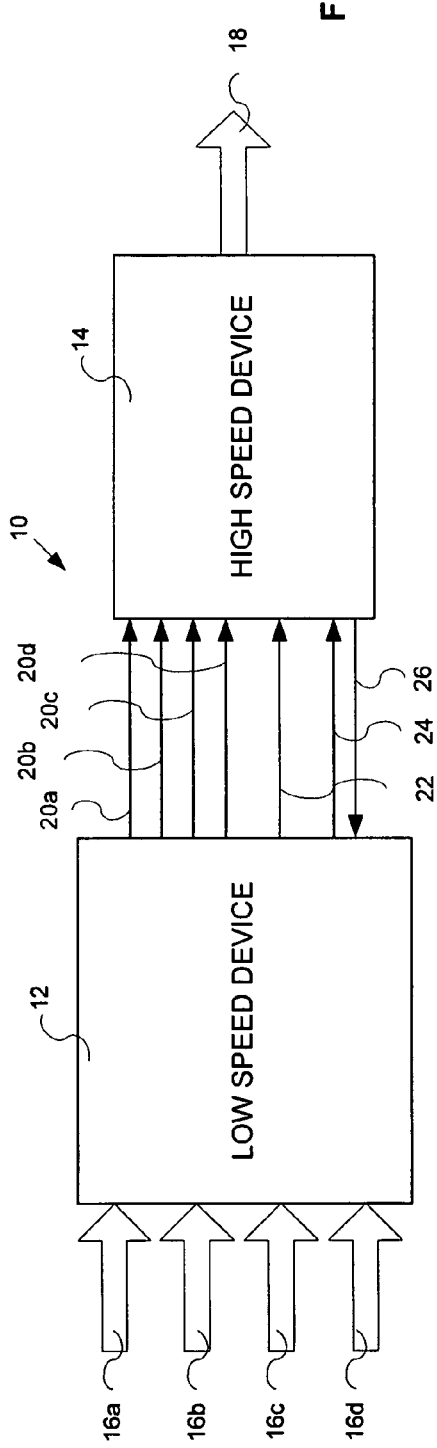

METHOD AND SYSTEM FOR PHASE AND BYTE ALIGNMENT ON A MULTIPLEXED HIGH SPEED BUS

FIELD OF THE INVENTION

The present invention relates to high speed signal multiplexing in particular to a method and system for maintaining phase (bit) and byte alignment among multiplexed signals such as may be found in a 40 giga-bit (Gbit) per second system.

BACKGROUND OF THE INVENTION

As demand for greater bandwidth and data throughput increases, so too does the demand placed on integrated circuits to accommodate the processing and transmission speeds needed to support increased data throughput. Such is particularly the case where semi-conductor integrated circuits are used within optical transmission systems. Because optical transmission systems can operate at speeds of 40 Gbits per second, semi-conductor integrated circuits must also be able to generate data streams at that rate in order to supply a constant supply of data to optical modulators. In other words, an optical modulation system that can modulate a signal to optically transmit at a 40 Gbit/Sec. rate must be supplied with a data stream of 40 Gbit/Sec. This requires that the underlying electronic components be capable of generating a 40 Gbit/Sec. data stream.

Proposed 40 Gbit/Sec. optical transmission schemes contemplate a complimentary metal-oxide semiconductor ("CMOS") silicon pre-processor application-specific integrated circuit ("ASIC") providing 4×10 Gbit/Sec. data channels to a bipolar or BiCMOS ASIC which then multiplexes the 4 channels together to create one 40 Gbit/Sec. stream of data. This 40 Gbit/Sec. stream of data is then sent to an optical driver chain and ultimately appears as an optical signal on a fiber optic cable.

A problem with this scheme is that the 4×10 Gbit/Sec. data streams can become skewed with respect to one another between the CMOS preprocessing ASIC and the 40 Gbit/Sec. multiplexing ASIC. In other words, for a given bit, e.g., bit 0, that bit in each of the data streams does not arrive at the 40 Gbit/Sec. multiplexing ASIC at the same time. The result is that the bits become jumbled and out of sequence when they are multiplexed, thereby throwing the streams out of byte alignment. In addition, if the timing at the input ports of the 40 Gbit/Sec. multiplexing ASIC is not correct for all 4 10 Gbit/Sec. channels, the data within each individual data stream can be corrupted as well. This problem results in the individual data streams being out of bit alignment. As such, for the 40 Gbit/Sec. multiplexing ASIC to work correctly, it must be able to sample the 4×10 Gbit/Sec. data channels for which the bit alignment may be more than 50% out of alignment and for which the word alignment may also be out of sync.

Proposals have been made to solve this problem. The first requires that the ASIC vendors provide a transmission port in which 4×10 Gbit/Sec. output streams are both bit and byte aligned. For this scheme to work, the package and track matching must be maintained to better than 20 picoseconds. However, current ASIC and field programmable gate array ("FPGA") vendors do not provide full bit and byte alignment in their devices even at 2.5 Gbit/Sec., let alone 10 Gbits/Sec. In part, this is because current suppliers treat each transmission port as an independent port without regard to subsequent multiplexing. In addition, bus margining at 10 Gbit/Sec. is quite difficult leaving an overall small timing margin.

Another proposal involves using the 10 Gbit/Sec. independent transmit devices on the silicon preprocessor ASIC described above. The 40 Gbit/Sec. multiplexing ASIC must then have an interface capable of fully recovering bit and byte alignment from the incoming data. A proposal has been made to use 4×10 Gbit/Sec. data channels with a $5^{th}$ 10 Gbit/Sec. data channel used to carry alignment data. This scheme has several drawbacks itself. As an initial matter, the scheme only works if the 40 Gbit/Sec. multiplexing ASIC is implemented in a BiCMOS technology such that the short macros that must be provisioned can be instantiated. This immediately limits the choice of semiconductor technology for the 40 Gbit/Sec. multiplexing ASIC and clock generation function to a fully bipolar technology. However, bipolar devices that are optimized for 40 Gbit/Sec. cannot be used. This arrangement also means that the BiCMOS device has to make a 10 Gbit/Sec. serializer/deserializer ("SERDES") link available in order to build the short port. For the most part, the CMOS device suppliers are only making 10 Gbit/Sec. links available in either 65 nanometer ("nm") or 45 nm CMOS-only technologies. SERDES devices are high speed devices used to convert parallel data to a serial data stream and vice versa and can be stand alone devices or incorporated in ASIC. However, in the case of prior art devices, a SERDES device in the ASIC may have only limited availability. In addition, SERDES devices are not simple to build. Also, if indium phosphide ("InP") technology or a gallium arsenide ("GaAs") process in which flip-flops are implemented in order to combine the 40 Gbit/Sec. multiplexing function with the modulator driver function is used, then the aforementioned SERDES devices cannot be implemented. Thus the second proposed solution seriously limits semiconductor technology selection.

In order to function in known operating environments, the aforementioned SERDES device can not operate at 10 Gbit/Sec. and must demultiplex the incoming 10 Gbit/Sec. data streams down to 340 Mbit/Sec. or 170 Mbit/Sec. in order to process the data and correct byte alignment. The 40 Gbit/Sec. multiplexing ASIC must then first remultiplex each data stream back up to 10 Gbit/Sec. and then to 40 Gbit/Sec. This represents a significant increase in power for the 40 Gbit/Sec. multiplexing ASIC. Multiple power supply levels must also be supported in such a case.

Both of the above schemes imply that the two alignments which must be achieved, namely detailed bit alignment to allow correct sampling of incoming bits, and byte alignment must be solved within the 40 Gbit/Sec. multiplexing ASIC. This assumption impairs technology choices, technology availability, and increases power and complexity. It is therefore desirable to have a method and system for a high speed multiplexing system, such as a 40 Gbit/Sec. multiplexing system, that preserves bit and byte alignment among the multiplexed data streams and which minimizes power consumption while allowing transmission system designers flexibility in the technology underlying the semiconductor devices that implement the multiplexing system.

SUMMARY OF THE INVENTION

The present invention advantageously provides a method and system for a multiplexing system that preserves bit and byte alignments in a high speed, e.g., 40 Gbit/Sec. environment, while allowing semiconductor technology choice and low power. The system includes a high speed integrated circuit and a low speed integrated circuit in which the functions used to achieve the above-described result are located in the most appropriate integrated circuit.

In accordance with one aspect, the present invention provides a system for multiplexing a plurality of serialized data signals in which a first integrated circuit device generates the plurality of serialized data signals. A second integrated circuit device is in electrical communication with the first integrated circuit device. The second integrated circuit device includes a multiplexer operable to generate a multiplexed output signal from the plurality of serialized data signals received from the first integrated circuit. A phase data and byte snapshot back channel is transmitted from the second integrated circuit device to the first integrated circuit device. The phase data and byte snapshot back channel carries phase data and periodic snapshots of the serialized data signals. The phase data and byte snapshot back channel is used by the first integrated circuit device to adjust the phase of each of the plurality of serialized data signals to preserve bit and byte alignment.

In accordance with another aspect, the present invention provides a multiplexing method in which a plurality of serialized data signals is generated by a first integrated circuit device. The plurality of serialized data signals is received by a second integrated circuit device. A multiplexed output signal is generated from the plurality of serialized data signals. A phase data and byte snapshot back channel is transmitted from the second integrated circuit device to the first integrated circuit device. The phase data and byte snapshot back channel carry phase data and periodic snapshots of the serialized data signals. The first integrated circuit device uses the phase data and periodic snapshots to adjust the phase of each of the plurality of serialized data signals to preserve bit and byte alignment.

In accordance with still another aspect, the present invention provides a multiplexing system in which a CMOS integrated circuit device generates a plurality of 10 Gbit/Sec. serialized data signals. A high speed integrated circuit device is in electrical communication with the CMOS integrated circuit device. The high speed integrated circuit device includes a multiplexer operable to generate a 40 Gbit/Sec. multiplexed output signal from the plurality of 10 Gbit/Sec. serialized data signals received from the CMOS integrated circuit. A phase data and byte snapshot back channel is transmitted from the high speed integrated circuit device to the CMOS integrated circuit device. The phase data and byte snapshot back channel carries phase data and periodic snapshots of the 10 Gbit/Sec. serialized data signals. The phase data and byte snapshot back channel is used by the CMOS integrated circuit device to adjust the phase of each of the plurality of 10 Gbit/Sec. serialized data signals to preserve bit and byte alignment.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein:

FIG. 1 is a block diagram of a system constructed in accordance with the principles of the present invention;

FIG. 2 is a diagram of a multi-channel bit stream showing bit and byte alignment;

DETAILED DESCRIPTION OF THE INVENTION

Figure 3:
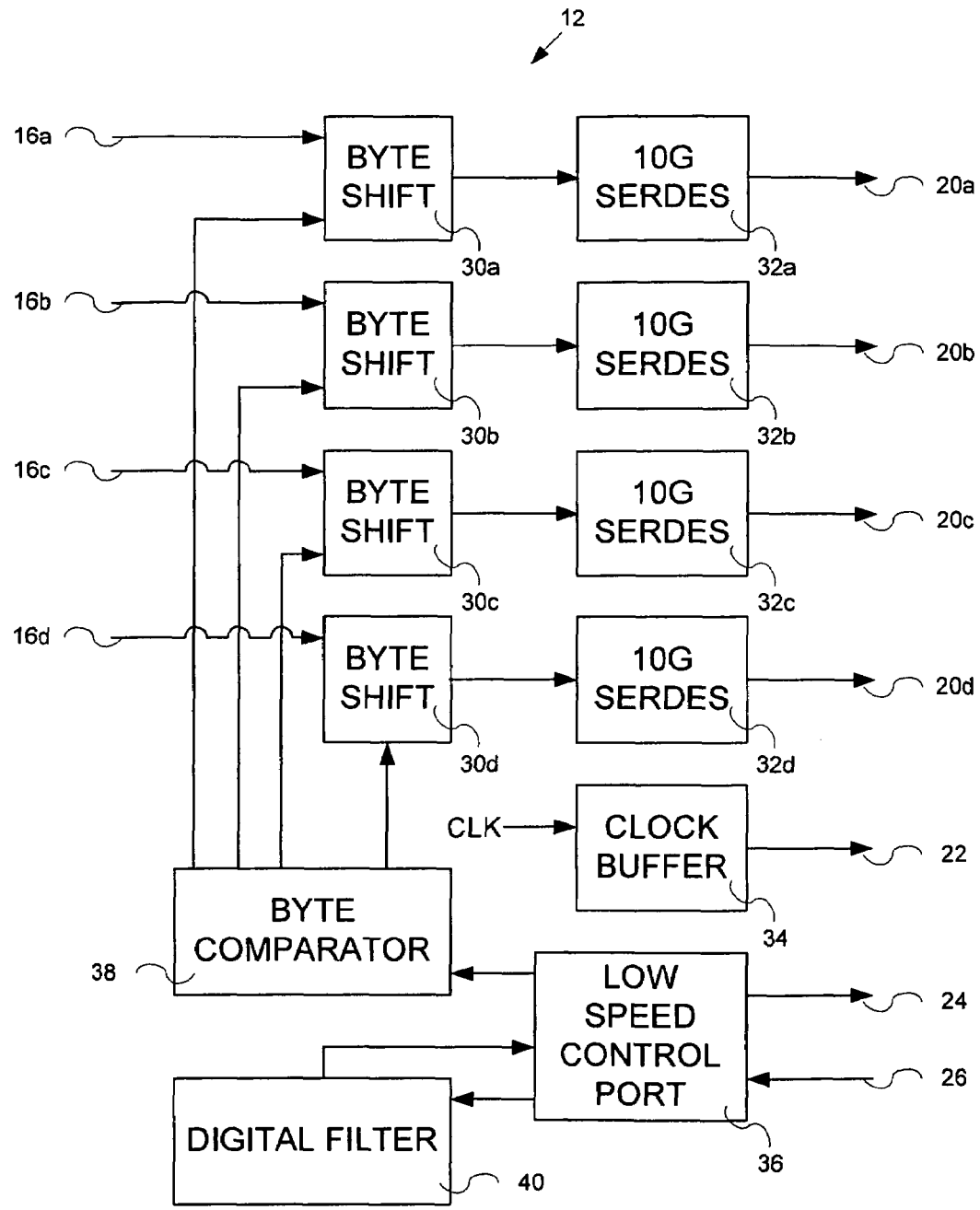
FIG. 3 is a block diagram of a multi-channel low speed device constructed in accordance with the principles of the present invention.

Referring now to the drawing figures in which like reference designators refer to like elements, there is shown in FIG. 1 a block diagram of high speed multiplexing system constructed in accordance with the principles of the present invention and designated generally as "10". System 10 includes low speed device 12 and high speed device 14. Low speed device 12 includes input signals 16a, 16b, 16c and 16d (referred to collectively herein as input signals 16), and high speed device 14 outputs a high speed output signal 18 that is a multiplexed version of input signals 16. Low speed device 12 can be a high gate count CMOS ASIC device. Input signals 16 are typically provided at the byte level, i.e., parallel signals, but are shown as a single line for simplicity. Output signal 18 can, for example, be supplied to optical modulators and other circuitry used to generate an optical signal for communication on a fiber optic cable.

Although it is contemplated that devices 12 and 14 can receive an input, communicate at any suitable data rate via serialized data signals 20a, 20b, 20c and 20d (referred to collectively herein as serialized data signals 20), input signals and output a multiplexed stream via output signal 18 at any suitable rate, the present invention is explained with reference to four 10 Gbit/Sec. serialized data streams 20a-d, and a 40 Gbit/Sec. multiplexed output signal 18. In other words, low speed device 12 outputs four 10 Gbit/Sec. serialized data streams and high speed device outputs a single a 40 Gbit/Sec. multiplexed output signal 18.

As is shown in FIG. 1, reference clock 22 and phase correction signal 24 are supplied by low speed device 12 to high speed device 14 and a phase data and byte snapshot back channel signal 26 is supplied by high speed device 14 to low speed device 12. These signals are explained in detail below.

Phase data and byte snapshot back channel signal 26 creates a reverse or back channel from the high speed device 14 to low speed device 12. The data on back channel signal 26 includes phase information as to the detailed bit alignment on each of the incoming 4×10 Gbit/Sec. serialized data signals 20 as well as periodic snapshots of the 10 Gbit/Sec. data which the high speed device 14 is multiplexing to 40 Gbit/Sec. Partitioning the bit and byte alignment control in this method advantageously places the complex high gate count circuitry on low speed device 12, e.g., a CMOS preprocessing ASIC, thus minimizing the circuitry on high speed device 14, e.g., the 40 Gbit/Sec. multiplexing ASIC to the point that high speed device 14 can be implemented using a purely bipolar or GaAs technology.

Achieving byte alignment is then accomplished as a core digital function on low speed device 12. Because low speed device 12 is responsible for and can determine what the data byte alignment is, it can compare the byte alignment returned for the snapshot bits and barrel shift the transmitted data until the returned snapshot is correct. The gates to perform the comparison can be implemented in any technology which can support SERDES devices, such as 10 Gbit/Sec. SERDES device (also referred to as "macros") even if the SERDES devices are fully independent. Also, because the cost in terms of gates to have high speed device 14 take a snapshot of the transmitted bits is small, i.e., no more than 25 flip-flops, the snapshot function can be implemented in a fully bipolar technology, a GaAs technology or a BiCMOS technology even if that technology does not have 10 Gbit/Sec. SERDES macros available. This is the case because, as is explained below in detail, no SERDES devices are used on high speed device 14.

Bit (phase) and byte alignment achieved by the present invention is explained with reference to FIG. 2. FIG. 2 shows a multi-channel bit stream having four bit streams 28a, 28b, 28c and 28d (referred to collectively herein as bit streams 28) such as of the type that may be carried by serialized data signals 20a, 20b, 20c and 20d, respectively. Each bit stream 28 shows an 8 bit byte in which each bit, i.e. bit 0, within each bit stream is aligned with the corresponding bit 0 in the other bit streams so that a given bit in each of the bit streams arrives at high speed device 14 at the same time. This is referred to as byte alignment. The present invention provides such an arrangement The present invention is also arranged such that each bit within a given bit stream, e.g. bit $1_a$ in bit stream 28a, is clocked into high speed device 14 in a manner in which it can be accurately read and not misinterpreted as the subsequent bit, e.g. bit $2_a$ in bit stream 28a, or the previous bit, e.g. bit $0_a$ in bit stream 28a. The result is that the bits in a given data stream are read into high speed device 14 in the correct sequential order. As is described below in detail, phase data and byte snapshot back channel signal 26 is used by low speed device 12 to adjust the phase of each serialized data signal 20 to preserve bit and byte alignment.

An exemplary multi-channel low speed device 12 constructed in accordance with the principles of the present invention is explained with reference to FIG. 3. Low speed device 12 includes a byte shift 30 (shown as byte shifts 30a, 30b, 30c and 30d) for each corresponding input signal 16. Each byte shift 30 is coupled to a respective SERDES 32 (shown as SERDES 32a, 32b, 32c and 32c). Because the present invention is explained with reference to 10 Gbit/Sec. serialized data signals 20, each SERDES 32 generates a 10 Gbit/Sec. signal. Byte shifts 30 align the bits by shifting bits until the snapshot returned from high speed device 14 via back channel 26 matches the intended byte alignment. SERDES 32 can be any CMOS SERDES operating to output a serialized channel at the desired signal rate, e.g., 10 Gbit/Sec. The present invention can be implemented using independent SERDES 32 devices, i.e., SERDES 32a is independent of SERDES 32b.

The exemplary multi-channel low speed device 12 shown in FIG. 3 also includes clock buffer 34, low speed control port 36, byte comparator 38 and digital filter 40. Clock buffer 34 can be any clock unit associated with SERDES devices. Clock buffer 34 outputs reference clock signal 22 to high speed device 14.

Low speed control port 36 includes those components needed to transmit phase correction signal 24 to high speed device 14 and receive phase data and byte snapshot back channel signal 26 from high speed device 14. Methods for incorporating low speed control ports into ASICs, such as CMOS ASICs are known. Low speed control port 36 passes the byte snapshot received from high speed device 14 to byte comparator 38. Byte comparator 38 compares the intended byte alignment with the alignment returned in the snapshot to determine if the two are the same. If they are not, byte comparator 38 instructs the corresponding byte shifts 30 to shift the byte alignment. This process continues until the intended byte alignment is the same as the alignment returned in the snapshot.

Low speed control port 36 also passes phase data received from high speed device 14 to digital filter 40. Digital filter 40 analyzes the phase data and generates phase correction data. The phase correction data is sent to low speed control port 36 for subsequent transmission to high speed device 14. As is discussed below in detail, high speed device 14 uses the phase correction data to control phase shift units therein.

The above-described components of low speed device 12 can be fabricated using CMOS technology in order to achieve the high gate count needed to implement all of the described components. However, because high speed (relative to a 40 Gbit/Sec. output) is not needed, it is not necessary to construct low speed device using the same technology as high speed device 14.

An exemplary high speed device 14 constructed in accordance with the principles of the present invention is described with reference to FIG. 4. High speed device 14 includes phase detector 42a, 42b, 42c and 42d (referred to collectively as phase detectors 42) which compare the phase of each incoming data stream 20a, 20b, 20c, and 20d, respectively, with a local clock (not shown). The phase state of each incoming data stream 20 is provided to a low speed control port 44 in high speed device 14 for transmission to digital filter 40 in low speed device 12. Of note, although not shown for the sake of simplicity of FIG. 4, each phase detector 42a, 42b, 42c and 42d is coupled to low speed control port 44.

Phase detectors 42 are included in high speed device 14 to achieve bit alignment. Because phase detectors also have low gate counts, phase detectors 42 can also be built in a fully bipolar or GaAs technology without the requirement for CMOS. As described above, the alteration of the phase based on the phase detected by the phase detectors in high speed device 14 is performed by low speed device 12.

Figure 4:
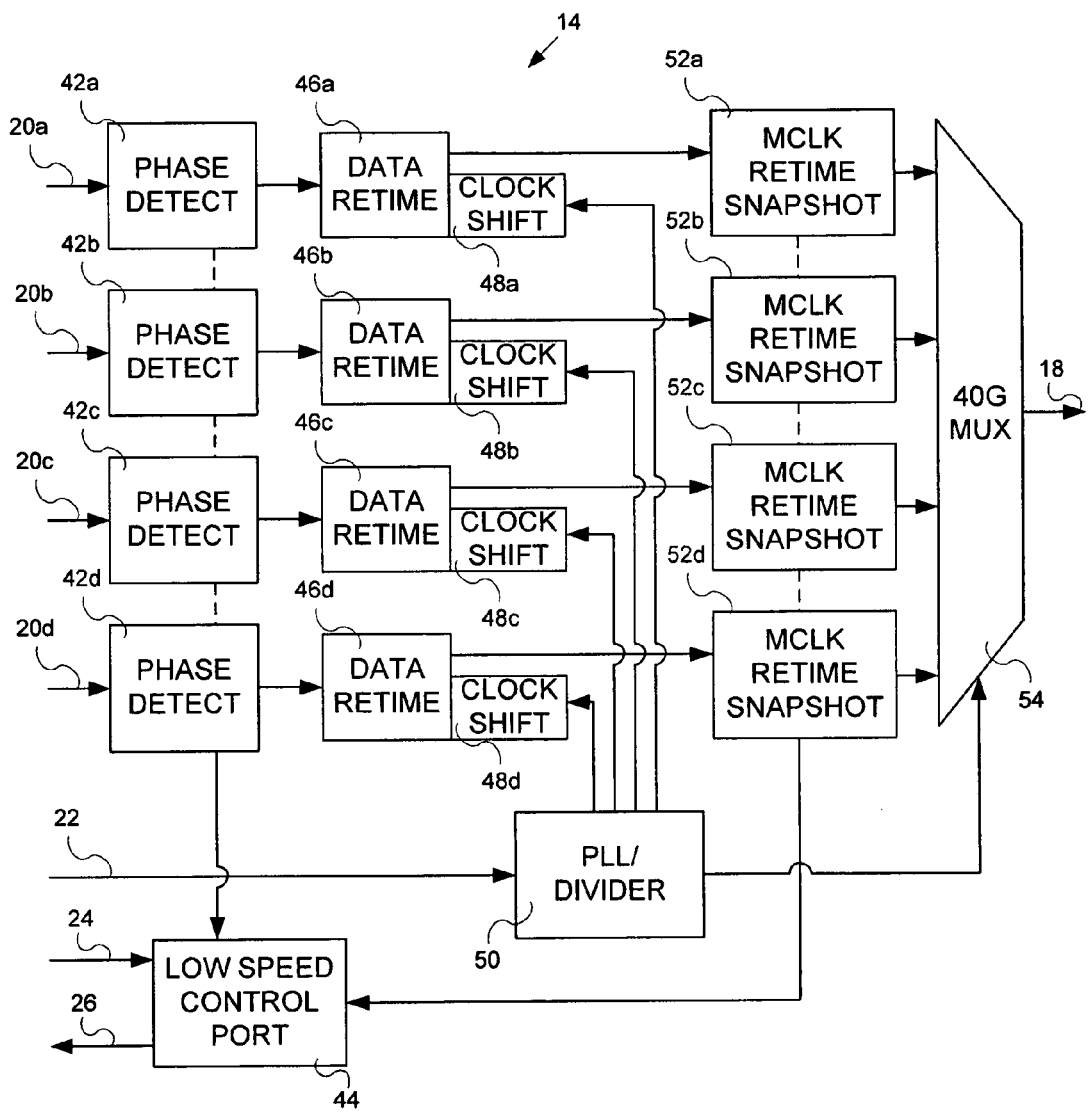
FIG. 4 is a block diagram of a high speed device constructed in accordance with the principles of the present invention.

High speed device 14 also includes data retimers 46 (shown in FIG. 4 as data retimers 46a, 46b, 46c and 46d) and clock shifters 48 (shown in FIG. 4 as clock shifters 48a, 48b, 48c and 48d). Data retimers 48 receive the serialized data signals from a corresponding phase detector 42 and, in conjunction with a corresponding clock shift 48, retime the data stream onto the local sampling clock. Phase locked loop ("PLL") and divider 50 generates the high speed clock for high speed, i.e. 40 Gbit/Sec., functions from an external reference and supplies the clock to clock shifters 48. In the case of the described embodiment, the external reference is clock buffer 34 in low speed device 12. It is also contemplated that the reference clock can be included in high speed device 14 and used to source PLL 50 as well as low speed device 12.

A method for achieving correct bit alignment uses the clock shifters 48. As these are very low gate count devices, the presence of clock shifters 48 does not impede the semiconductor technology choice available to circuit designers. Clock shifters 48 adjust the sample clock on the associated 10 Gbit/Sec. input port such that the data is properly sampled. Although not shown, the state of each clock shifter 48 is controlled from the low speed device 12 via phase correction signal 24.

High speed device 14 also includes master clock retime and snapshot devices 52a, 52b, 52c and 52d (referred to collectively as master clock retime and snapshot devices 52) which receive a retimed serialized data stream from a corresponding data retimer 46 and, after retiming the data stream onto the master clock and capturing intermittent data snapshots, provides the serialize data streams to multiplexer 54. Of note, although not shown for the sake of simplicity of FIG. 4, each master clock retime and snapshot device 52a, 52b, 52c and 52d is coupled to low speed control port 44.

Multiplexer 54 multiplexes the incoming serialized and retimed data streams for output as multiplexed output signal 18. In the embodiment described herein, multiplexer 54 outputs a 40 Gbit/Sec. signal and includes the hardware needed to drive output signal 18 to another device in the system, such as an optical modulator. Multiplexer 54 is coupled to PLL 50 for clock and timing synchronization. Although not shown, multiplexer 54 can also accumulate phase information to allow periodic transmission of that information to low speed device 12 via low speed control port 44.

The present invention advantageously provides reverse byte timing such that the ultimate timing of serialized data signals 20 is controlled by low speed device 12 based on feedback from high speed device 14. This arrangement reduces the gate count requirements of high speed device 14 and places a high gate count requirement on low speed device 12, where such a requirement can be met using CMOS technology. In addition, because low speed device 12 can be implemented using CMOS technology, standard CMOS SERDES devices 32 can be used.

The present invention also advantageously provides a modified reverse clock timing. Prior art systems return clocks on matched paths. However, this arrangement is not accurate enough for 10 Gbit/Sec. speeds. The present invention implements reverse clock timing by making a phase measurement on high speed device 14 and sending the clock phase result to low speed device 12 for processing and clock phase adjustment.

Of note, it is presumed that one of skill in the art of ASIC design can design the specific circuitry needed to implement the blocks and functions described herein. The present invention advantageously provides a method and system that achieves bit and byte alignment for a multiplexed input bus, such as a 4×10 Gbit/Sec. input bus that is input to a high speed, i.e., 40 Gbit/Sec. multiplexing ASIC, in a manner that does not incur a high gate count penalty. The present invention also allows the use of bipolar or GaAs semiconductor technology in the high speed multiplexing ASIC while allowing the high speed multiplexing ASIC to function as the high speed multiplexer, generate a 40 GHz clock and drive the resultant multiplexed 40 GHz signal.

The present invention also advantageously allows processing to correct/maintain bit and byte alignment to occur on the low speed ASIC where having a high semiconductor gate count is not an issue. The present invention also avoids the need to demultiplex the underlying low speed data signals, i.e., the individual 10 GBit/Sec. signals in order to process them for bit (phase) and byte alignment status.

Unless mention was made above to the contrary, it should be noted that all of the accompanying drawings are not to scale. Significantly, this invention can be embodied in other specific forms without departing from the spirit or essential attributes thereof, and accordingly, reference should be had to the following claims, rather than to the foregoing specification, as indicating the scope of the invention.

What is claimed is:

1. A multiplexing system, comprising:
    a first integrated circuit device, the first integrated circuit device generating a plurality of serialized data signals;
    a second integrated circuit device in electrical communication with the first integrated circuit device, the second integrated circuit device including a multiplexer operable to generate a multiplexed output signal from the plurality of serialized data signals received from the first integrated circuit device; and
    a phase data and byte snapshot back channel transmitted from the second integrated circuit device to the first integrated circuit device, the phase data and byte snapshot back channel carrying phase information regarding bit alignment for each of the plurality of serialized data signals and periodic snapshots regarding byte alignment of the serialized data signals, the phase data and byte snapshot back channel being used by the first integrated circuit device to adjust the phase of each of the plurality of serialized data signals to preserve bit and byte alignment.

2. The multiplexing system of claim 1, wherein the first integrated circuit device is a CMOS device.

3. The multiplexing system of claim 1, wherein the second integrated circuit device is one of a bipolar and GaAs device.

4. The multiplexing system of claim 1, wherein each of the plurality of serialized data signals is a 10 Gbit/Sec. signal and the multiplexed output signal is a 40 Gbit/Sec. signal.

5. The multiplexing system of claim 1, wherein the second integrated circuit device detects the phase of each of the plurality of serialized data signals and takes the periodic snapshots of the serialized data signals.

6. The multiplexing system of claim 5, wherein the second integrated circuit device includes a phase detector to detect the phase of each of the plurality of serialized data signals, the phase detector generating the phase data signal for a corresponding phase state of each of the plurality of serialized data signals, the phase data signal being used by the first integrated circuit device to adjust the phase of the corresponding serialized data signals to achieve bit alignment within each of the serialized data signals.

7. The multiplexing system of claim 5, wherein the second integrated circuit device includes a master clock retime and snapshot device to retime each of the serialized data signals onto a master clock and capture intermittent data snapshots from each of the serialized data signals, the intermittent data snapshots being used by the first integrated circuit device to achieve byte alignment among the plurality of serialized data signals.

8. The multiplexing system of claim 1, wherein the multiplexer is arranged to drive the output signal for transmission to an optical transmitter.

9. The multiplexing system of claim 1, wherein the first integrated circuit includes a digital filter, the digital filter analyzing the phase data and generating phase correction data for subsequent transmission to the second integrated circuit.

10. The multiplexing system of claim 1, wherein the first integrated circuit includes a byte shifter, the byte shifter aligning the bits of a corresponding serialized data signal by shifting bits until the snapshot data returned from the second integrated circuit device matches an intended byte alignment.

11. The multiplexing system of claim 10, wherein the first integrated circuit includes a byte comparator, the byte comparator comparing the intended byte alignment with the alignment in the snapshot data to determine if the two are the same.

12. The multiplexing system of claim 11, wherein the first integrated circuit further includes a SERDES device in electrical communication with the byte shifter, the SERDES device serializing the byte aligned data and transmitting a serialized data signal to the second integrated circuit device.

13. A multiplexing method, comprising:
    generating a plurality of serialized data signals in a first integrated circuit device;
    receiving the plurality of serialized data signals in a second integrated circuit device;
    generating a multiplexed output signal from the plurality of serialized data signals; and
    transmitting a phase data and byte snapshot back channel from the second integrated circuit device to the first integrated circuit device, the phase data and byte snapshot back channel carrying phase information regarding bit alignment for each of the plurality of serialized data signals and periodic snapshots regarding byte alignment of the serialized data signals; and using the first integrated circuit device to adjust the phase of each of the plurality of serialized data signals to preserve bit and byte alignment.

14. The multiplexing method of claim 13, wherein the first integrated circuit device is a CMOS device.

15. The multiplexing method of claim 13, wherein the second integrated circuit device is one of a bipolar and GaAs device.

16. The multiplexing method of claim 13, wherein each of the plurality of serialized data signals is a 10 Gbit/Sec. signal and the multiplexed output signal is a 40 Gbit/Sec. signal.

17. The multiplexing method of claim 13, further comprising using the second integrated circuit device to detect the phase of each of the plurality of serialized data signals and take the periodic snapshots of the serialized data signals.

18. The multiplexing method of claim 17, further including:
   detecting the phase of each of the plurality of serialized data signals; and
   generating the phase data signal for a corresponding phase state of each of the plurality of serialized data signals; and
   adjusting the phase of the corresponding serialized data signals to achieve bit alignment within each of the serialized data signals.

19. The multiplexing method of claim 17, further including:
   retiming each of the serialized data signals onto a master clock;
   capturing intermittent data snapshots from each of the serialized data signals; and
   using the first integrated circuit device to achieve byte alignment among the plurality of serialized data signals.

20. The multiplexing method of claim 13, further including:
   analyzing the phase data; and
   generating phase correction data for subsequent transmission to the second integrated circuit.

21. The multiplexing method of claim 13, the method further including aligning the bits of a corresponding serialized data signal by shifting bits until the snapshot data returned from the second integrated circuit device matches an intended byte alignment.

22. The multiplexing method of claim 21, the method further including comparing the intended byte alignment with the alignment in the snapshot data to determine if the two are the same.

23. The multiplexing method of claim 21, the method further including serializing the byte aligned data and transmitting a serialized data signal to the second integrated circuit device.

24. A multiplexing system, the multiplexing system comprising:
   a CMOS integrated circuit device, the CMOS integrated circuit device generating a plurality of 10 Gbit/Sec. serialized data signals;
   a high speed integrated circuit device in electrical communication with the CMOS integrated circuit device, the high speed integrated circuit device including a multiplexer operable to generate a 40 Gbit/Sec. multiplexed output signal from the plurality of 10 Gbit/Sec. serialized data signals received from the CMOS integrated circuit; and
   a phase data and byte snapshot back channel transmitted from the high speed integrated circuit device to the CMOS integrated circuit device, the phase data and byte snapshot back channel carrying phase information regarding bit alignment for each of the plurality of serialized data signals and periodic snapshots regarding byte alignment of the 10 Gbit/Sec. serialized data signals, the phase data and byte snapshot back channel being used by the CMOS integrated circuit device to adjust the phase of each of the plurality of 10 Gbit/Sec. serialized data signals to preserve bit and byte alignment.

25. The multiplexing system of claim 24, wherein the high speed integrated circuit device is one of a bipolar and GaAs device.

* * * * *